United States Patent
Qiao et al.

(10) Patent No.: US 11,502,704 B2
(45) Date of Patent: Nov. 15, 2022

(54) POLAR CODING METHOD AND APPARATUS

(71) Applicant: Huawei Technologies Co., Ltd., Shenzhen (CN)

(72) Inventors: Yunfei Qiao, Hangzhou (CN); Yinggang Du, Shenzhen (CN); Juan Song, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/322,529

(22) Filed: May 17, 2021

(65) Prior Publication Data

US 2021/0328599 A1  Oct. 21, 2021

Related U.S. Application Data

(63) Continuation of application No. PCT/CN2019/112714, filed on Oct. 23, 2019.

(30) Foreign Application Priority Data

Nov. 16, 2018  (CN) .......................... 201811363673.8

(51) Int. Cl.
*H03M 13/11* (2006.01)
*H03M 13/00* (2006.01)
(Continued)

(52) U.S. Cl.
CPC ...... *H03M 13/1111* (2013.01); *H03M 13/611* (2013.01); *H04L 1/0057* (2013.01)

(58) Field of Classification Search
CPC ............ H03M 13/1111; H03M 13/611; H03M 13/635; H03M 13/13; H03M 13/618; H03M 13/6362; H04L 1/0057
See application file for complete search history.

(56) References Cited

U.S. PATENT DOCUMENTS 9,628,113 B2 * 4/2017 Jeong .................... H04L 1/0041
10,979,076 B2 * 4/2021 Chen ........................ H04L 1/00
(Continued)

FOREIGN PATENT DOCUMENTS

CN   107332570 A   11/2017
CN   107342774 A   11/2017
(Continued)

OTHER PUBLICATIONS

"3rd Generation Partnership Project; Technical Specification Group Radio Access Network; 5G; NR; Multiplexing and channel coding (Release 15)," 3GPP TS 38.212 V15.3.0, Total 102 pages, 3rd Generation Partnership Project, Valbonne, France (Oct. 2018).
(Continued)

*Primary Examiner* — Justin R Knapp
(74) *Attorney, Agent, or Firm* — Leydig, Voit & Mayer, Ltd.

(57) ABSTRACT

The present disclosure relates to the field of communication technologies, and discloses a polar coding/decoding method and apparatus, to improve sequence lookup efficiency. The method includes: obtaining a first sequence from a polar code construction sequence table based on a coding parameter, where the polar code construction sequence table includes at least one coding parameter and at least one sequence corresponding to the at least one coding parameter, the at least one coding parameter is mapped to the at least one sequence in a one-to-one manner, the first sequence is one of the at least one sequence; selecting serial numbers of K polarized channels from the first sequence based on a rate matching scheme and/or a reliability order; placing to-be-coded bits based on the selected serial numbers of the K polarized channels; and performing polar coding, to obtain a coded bit sequence.

18 Claims, 7 Drawing Sheets

(51) Int. Cl.
*H03M 13/15* (2006.01)
*H04L 1/00* (2006.01)

(56) References Cited

U.S. PATENT DOCUMENTS

| | | | |
|---|---|---|---|
| 11,206,045 B1* | 12/2021 | Khan | H03M 13/2906 |
| 11,211,947 B2* | 12/2021 | Qiao | H04L 1/00 |
| 2016/0013810 A1 | 1/2016 | Gross et al. | |
| 2018/0026663 A1 | 1/2018 | Wu et al. | |
| 2018/0076922 A1 | 3/2018 | Zhang et al. | |
| 2021/0328603 A1* | 10/2021 | Chen | H03M 13/618 |

FOREIGN PATENT DOCUMENTS

| | | |
|---|---|---|
| CN | 108111252 A | 6/2018 |
| CN | 108282260 A | 7/2018 |
| CN | 108540259 A | 9/2018 |
| CN | 108650053 A | 10/2018 |
| CN | 108809486 A | 11/2018 |
| EP | 3273603 A1 | 1/2018 |
| WO | 2018202080 A1 | 11/2018 |

OTHER PUBLICATIONS

"DCI CRC Initialization and Masking," 3GPP TSG RAN WG1 Meeting 91, R1-1721428, Reno, USA, pp. 1-8, 3rd Generation Partnership Project, Valbonne, France (Nov. 27-Dec. 1, 2017).

"Remaining details on PBCH polar code construction," 3GPP TSG RAN WG1 #91, R1-1720357, Reno, NV, USA, pp. 1-4, 3rd Generation Partnership Project, Valbonne, France (Nov. 27-Dec. 1, 2017).

"Polar Code Construction for PBCH," 3GPP TSG RAN WG1 Meeting 90bis, Prague, CZ, R1-1717690, pp. 1-8, 3rd Generation Partnership Project, Valbonne, France (Oct. 9-13, 2017).

Schnelling et al., "Construction of Polar Codes Exploiting Channel Transformation Structure," IEEE Communications Letters, vol. 19, No. 12, pp. 2058-2061, Institute of Electrical and Electronics Engineers, New York, New York (Dec. 2015).

* cited by examiner

POLAR CODING METHOD AND APPARATUS

CROSS-REFERENCE TO RELATED APPLICATIONS

This application is a continuation of International Patent Application PCT/CN2019/112714, filed on Oct. 23, 2019, which claims priority to Chinese Patent Application No. 201811363673.8, filed on Nov. 16, 2018. The disclosures of the aforementioned applications are hereby incorporated by reference in their entireties.

TECHNICAL FIELD

Embodiments of this application relate to the field of communication technologies, and in particular, to a polar coding method and apparatus.

BACKGROUND

As the most basic radio access technology, channel coding plays an important role in ensuring reliable data transmission. In an existing wireless communication system, the channel coding is generally performed by using a turbo code, a low density parity check (LDPC) code, and a polar code. The turbo code cannot support information transmission that is performed at an excessively low or high bit rate. However, for transmission of medium-size and short packets, it is difficult for the turbo code and the LDPC code to achieve ideal performance in a limited code length due to coding/decoding characteristics of the turbo code and the LDPC code. In terms of implementation, the turbo code and the LDPC code have relatively high calculation complexity in a coding/decoding implementation process. The polar code is a good code that has relatively simple coding and decoding complexity, and it is theoretically proved that a Shannon capacity can be obtained if coding is performed by using the polar code. Therefore, the polar code is increasingly widely applied.

However, with rapid evolution of the wireless communication system, communication systems such as a 5th generation (5G) communication system will have some new characteristics. For example, the most typical three communication scenarios include enhanced mobile broadband (eMBB), massive machine-type communications (mMTC), and ultra-reliable low-latency communication (URLLC). These communication scenarios impose higher requirements on coding/decoding performance of the polar code.

SUMMARY

Embodiments of this application provide a polar coding method and apparatus, to reduce an operation delay in obtaining a first sequence used for polar coding.

Specific technical solutions provided in the embodiments of this application are as follows:

According to a first aspect, a polar coding method is provided. A coding apparatus obtains a first sequence from a polar code construction sequence table based on a coding parameter, where the polar code construction sequence table includes at least one coding parameter and at least one sequence corresponding to the at least one coding parameter, the at least one coding parameter is mapped to the at least one sequence in a one-to-one manner, the first sequence is one of the at least one sequence, the first sequence includes serial numbers of polarized channels and the serial numbers are arranged in ascending or descending order of reliability of the polarized channels, the reliability of the polarized channels corresponds to the serial numbers of the polarized channels, and the coding parameter includes at least one of a mother code length, a quantity of to-be-coded information bits, and a quantity of bits obtained after rate matching; placing to-be-coded bits based on serial numbers of K polarized channels determined based on the first sequence, and performing polar coding on the to-be-coded bits, to obtain a coded bit sequence, where the serial numbers of the K polarized channels determined based on the first sequence are determined based on a rate matching scheme and/or a reliability order. Compared with an existing solution, the present disclosure provides a solution of directly selecting the first sequence from a prestored sequence, so that an operation of performing nested reading in a maximum mother code sequence stored in a system is omitted, thereby reducing an operation delay.

In a possible design, the first sequence includes serial numbers of L polarized channels, L is a positive integer, L is equal to K or N, N is a mother code length of a polar code, $N=2^n$, n is a positive integer, K is a quantity of the to-be-coded bits, and K is less than or equal to N; or the first sequence includes the serial numbers of the K polarized channels, and K is a positive integer.

In a possible design, a length of the first sequence used for polar coding of a PBCH channel is 56, serial numbers in the first sequence are arranged in ascending order of reliability, the serial numbers that are of the polarized channels and that correspond to the first sequence start from 0, and the first sequence is stored as [441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511]. It should be noted that, the foregoing sequence may be alternatively stored as [247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511] in a natural order. Polarized channels whose serial numbers are [446, 478, 487, 490, 491, 492, 493, 494, 495, 497, 498, 499, 500, 501, 502, 503, 504, 505, 506, 507, 508, 509, 510, 511] are used to place cyclic redundancy check (CRC) bits.

In a possible design, the first sequence is all or a subsequence of a second sequence, where the second sequence includes serial numbers of $N_{max}$ polarized channels, the serial numbers of the $N_{max}$ polarized channels are arranged in the second sequence in ascending or descending order of reliability of the $N_{max}$ polarized channels, $N_{max}$ is a positive integer, $N_{max}$ is greater than or equal to N, and a reliability order of the serial numbers of the polarized channels in the first sequence is consistent with a reliability order of serial numbers, of polarized channels, less than N in the second sequence.

In a possible design, the first sequence may be a part or all of any sequence shown in a sequence Q1 to a sequence Q6 in the specification, and serial numbers of N polarized channels in the first sequence are arranged in ascending order of reliability of the N polarized channels, and a minimum value of the serial numbers of the polarized channels is 0.

In a possible design, the first sequence is a part or all of any sequence shown in a table Q1 to a table Q6 in the specification, and serial numbers of N polarized channels in the first sequence are arranged in ascending order of reliability of the N polarized channels, and a minimum value of the serial numbers of the polarized channels is 0.

According to a second aspect, a polar code decoding method is provided. A decoding apparatus obtains to-be-decoded bits; the decoding apparatus obtains a first sequence from a polar code construction sequence table based on a decoding parameter, where the polar code construction sequence table includes at least one decoding parameter and at least one sequence corresponding to the at least one decoding parameter, the at least one decoding parameter is mapped to the at least one sequence in a one-to-one manner, the first sequence is one of the at least one sequence, the first sequence includes serial numbers of polarized channels and is arranged in ascending or descending order of reliability of the polarized channels, the reliability of the polarized channels corresponds to the serial numbers of the polarized channel, and the decoding parameter includes at least one of a mother code length, a quantity of to-be-decoded bits, and a quantity of bits obtained after rate matching; and performing polar decoding on the to-be-decoded bits based on serial numbers of K polarized channels determined based on the first sequence, to obtain the K to-be-decoded information bits, where the serial numbers of the K polarized channels determined based on the first sequence are determined based on a rate matching scheme and/or a reliability order.

In a possible design, the first sequence includes serial numbers of L polarized channels, L is a positive integer, L is equal to K or N, N is a mother code length of a polar code, $N=2^n$, n is a positive integer, K is a quantity of the to-be-decoded information bits, and K is less than or equal to N.

In a possible design, the second sequence includes serial numbers of N polarized channels, the serial numbers of the N polarized channels are arranged in the second sequence in ascending or descending order of reliability of the N polarized channels.

In a possible design, the first sequence is a part or all of any sequence shown in a sequence Q1 to a sequence Q6 in the specification, and serial numbers of N polarized channels in the first sequence are arranged in ascending order of reliability of the N polarized channels, and a minimum value of the serial numbers of the polarized channels is 0.

In a possible design, the first sequence is a part or all of any sequence shown in a table Q1 to a table Q6 in the specification, and serial numbers of N polarized channels in the first sequence are arranged in ascending order of reliability of the N polarized channels, and a minimum value of the serial numbers of the polarized channels is 0.

In a possible design, the first sequence and/or the second sequence is prestored.

In a possible design, the first sequence is used for polar coding of a PBCH channel, and is stored as [247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511] in a natural order, where the serial numbers that are of the polarized channels and that correspond to the first sequence start from 0.

In a possible design, polarized channels whose serial numbers are [446, 478, 487, 490, 491, 492, 493, 494, 495, 497, 498, 499, 500, 501, 502, 503, 504, 505, 506, 507, 508, 509, 510, 511] in the first sequence are used to place cyclic redundancy check bits.

In a possible design, the serial numbers of the N polarized channels are 0 to (N−1) or 1 to N.

In a possible design, the K to-be-decoded bits include cyclic redundancy check bits.

In a possible design, the K to-be-decoded bits include parity check bits.

According to a third aspect, a polar coding apparatus is provided. The apparatus has functions of implementing the method according to any one of the first aspect or the possible designs of the first aspect. The functions may be implemented by hardware, or may be implemented by hardware by executing corresponding software. The hardware or the software includes one or more modules corresponding to the foregoing functions.

In a possible design, when some or all of the functions are implemented by hardware, the polar coding apparatus includes an input interface circuit, configured to obtain to-be-coded bits; a logic circuit, configured to perform the behavior described in any one of the first aspect and the possible designs of the first aspect; and an output interface circuit, configured to output a coded bit sequence.

In a possible design, when some or all of the functions are implemented by software, the polar coding apparatus includes: a memory, configured to store a program; and a processor, configured to execute the program stored in the memory. When the program is executed, the polar coding apparatus may implement the method in any one of the first aspect and the possible designs of the first aspect.

Optionally, the memory may be a physically independent unit, or may be integrated with the processor.

In a possible design, when some or all of the functions are implemented by software, the polar coding apparatus includes a processor. A memory configured to store a program is located outside the coding apparatus. The processor is connected to the memory by using a circuit/wire, and is configured to read and execute the program stored in the memory.

According to a fourth aspect, a polar code decoding apparatus is provided. The apparatus has functions of implementing the method in any one of the second aspect or the possible designs of the second aspect. The functions may be implemented by hardware, or may be implemented by hardware by executing corresponding software. The hardware or the software includes one or more modules corresponding to the foregoing functions.

In a possible design, when some or all of the functions are implemented by hardware, the polar code decoding apparatus includes an input interface circuit, configured to obtain to-be-decoded bits; a logic circuit, configured to perform the behavior described in any one of the second aspect and the possible designs of the second aspect; and an output interface circuit, configured to output a sequence of K decoded information bits.

In a possible design, when some or all of the functions are implemented by software, the polar code decoding apparatus includes: a memory, configured to store a program; and a processor, configured to execute the program stored in the memory. When the program is executed, the polar code decoding apparatus may implement the method in any one of the second aspect and the possible designs of the second aspect.

Optionally, the memory may be a physically independent unit, or may be integrated with the processor.

In a possible design, when some or all of the functions are implemented by software, the polar code decoding apparatus includes a processor. A memory configured to store a program is located outside the decoding apparatus. The processor is connected to the memory by using a circuit/wire, and is configured to read and execute the program stored in the memory.

According to a fifth aspect, a communication system is provided. The communication system includes a network device and a terminal. The network device or the terminal may perform the method according to any one of the first aspect and the possible designs of the first aspect.

According to a sixth aspect, a communication system is provided. The communication system includes a network device and a terminal. The network device or the terminal may perform the method according to any one of the second aspect and the possible designs of the second aspect.

According to a seventh aspect, a computer storage medium is provided. The computer storage medium stores a computer program, and the computer program includes instructions used to perform the method according to any one of the third aspect or the possible designs of the third aspect.

According to an eighth aspect, a computer storage medium is provided. The computer storage medium stores a computer program, and the computer program includes instructions used to perform the method according to any one of the fourth aspect or the possible designs of the fourth aspect.

According to a ninth aspect, an embodiment of this application provides a computer program product including instructions. When the instructions are run on a computer, the computer is enabled to perform the method in the foregoing aspects.

According to a tenth aspect, a wireless device is provided. The wireless device includes a coding apparatus configured to implement any one of the first aspect and the possible designs of the first aspect, a modulator, and a transceiver.

The modulator is configured to modulate a coded bit sequence to obtain a modulated sequence.

The transceiver is configured to send the modulated sequence.

In a possible design, the wireless device is a terminal or a network device.

According to an eleventh aspect, a wireless device is provided. The wireless device includes a decoding apparatus configured to implement any one of the second aspect and the possible designs of the second aspect, a demodulator, and a transceiver.

The transceiver is configured to receive a modulated sequence.

The demodulator is configured to demodulate the modulated sequence to obtain a to-be-decoded sequence.

In a possible design, the wireless device is a terminal or a network device.

DESCRIPTION OF EMBODIMENTS

Figure 1:
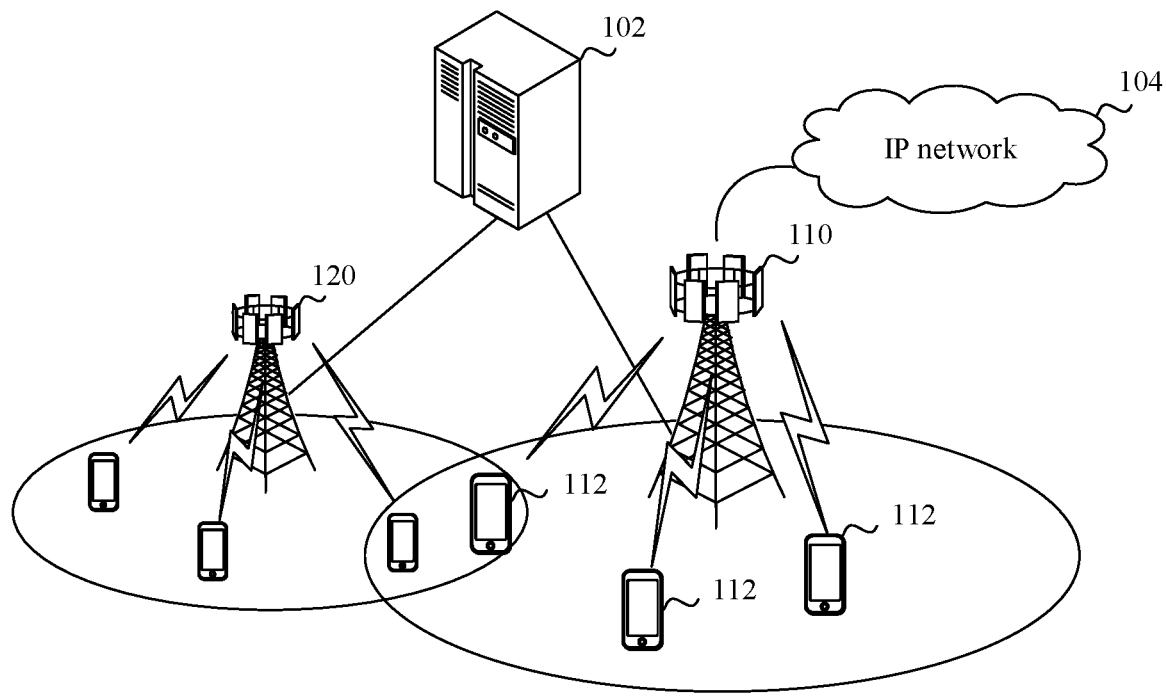
FIG. 1 is a schematic diagram of a communication system architecture to which an embodiment of this application is applied.

A reliability order of polarized channels plays an important role in polar coding/decoding performance. In an existing technical solution, during obtaining of a construction sequence used for polar coding, a construction sequence with a target code length can be read from a prestored longest mother code sequence only based on a nesting characteristic. This step causes extra operation overheads. Considering this, a new technical solution may be designed to reduce an operation delay.

The following describes in detail embodiments of this application with reference to accompanying drawings.

The embodiments of this application provide a polar coding method and apparatus, to obtain a reliability order based on reliability of polarized channels, select, based on the reliability order, serial numbers of polarized channels used to send information bits, and perform polar coding based on the selected serial numbers of the polarized channels. Based on the embodiments of this application, reliability of each polar code subchannel can be more accurately calculated. The following describes in detail the coding method and apparatus provided in the embodiments of the present disclosure with reference to the accompanying drawings.

To facilitate understanding of the embodiments of this application, a polar code is briefly described below.

A coding policy of the polar code is to transmit information useful to a user through a noiseless channel, and transmit agreed information through a pure noisy channel, or transmit no information through a pure noisy channel. The polar code is a linear block code. A coding matrix of the polar code is $G_N$, and a coding process is $x_1^N = u_1^N G_N$. $u_1^N = (u_1, u_2, \ldots, u_N)$ is a binary row vector with a length of N (code length), $G_N$ is a matrix of N×N, and $G_N = F_2^{\otimes (\log_2(N))}$. $F_2^{\otimes (\log_2(N))}$ is defined as a Kronecker product of $\log_2 N$ matrices $F_2$. The foregoing matrix $$F_2 = \begin{bmatrix} 1 & 0 \\ 1 & 1 \end{bmatrix}.$$

In the coding process of the polar code, one part of bits in $u_1^N$ are used to carry information, and are referred to as a set of information bits, where a set of indexes of the bits is denoted as A; and another part of bits are set to a fixed value agreed upon between a receive end and a transmit end in advance, and are referred to as a set of fixed bits or a set of frozen bits, where a set of indexes of the bits is indicated by a complementary set $A^c$ of A. The coding process of the polar code is equivalent to $x_1^N = u_A G_N (A) \oplus u_{A^c} G_N (A^C)$. Herein, $G_N(A)$ is a submatrix that is of $G_N$ and that includes rows corresponding to the indexes in the set A, and $G_N(A^C)$ is a submatrix that is of $G_N$ and that includes rows corresponding to the indexes in the set $A^c$. $u_A$ is a set that is of information bits and that is in $u_1^N$, and a quantity of the information bits is K. Usually, various types of check bits including but not limited to a CRC bit and a parity check (PC) bit are also included in the set of information bits. $u_{A^c} u_{A^c}$ is a set that is of fixed bits and that is in $u_1^N$, a quantity of the fixed bits is (N−K), and the fixed bits are known bits. These fixed bits are generally set to 0. However, the fixed bits may be set randomly provided that the receive end and the transmit end have agreed in advance. Therefore, a coding output of the polar code may be simplified as $x_1^N = u_A G_N(A)$. Herein, $u_A$ is the set that is of information bits and that is in $u_1^N$, and $u_A$ is a row vector with a length of K, to be specific, $|A|=K$. $|\cdot|$ indicates a quantity of elements in the set, K is an information block size, $G_N(A)$ is a submatrix that is of the matrix $G_N$ and that includes the rows corresponding to the indexes in the set A, and $G_N(A)$ is a matrix of K×N.

A construction process of the polar code is a selection process of the set A, and determines performance of the polar code. The construction process of the polar code is usually as follows: It is determined, based on a mother code length N, that there are N polarized channels in total corresponding to N rows of a coding matrix respectively. Reliability of the polarized channels is calculated. Indexes of first K polarized channels with relatively high reliability are used as elements of the set A, and indexes corresponding to remaining (N−K) polarized channels are used as elements of the set $A^c$ of the indexes of the fixed bits. The set A determines locations of the information bits, and the set $A^c$ determines locations of the fixed bits. A serial number of a polarized channel is a location index of an information bit or a fixed bit, that is, a location index in $u_1^N$.

The solution provided in the embodiments of this application relates to how to determine reliability of a polarized channel. A basic inventive idea of the embodiments of this application is as follows: The reliability of the polarized channel may be represented by using reliability, and a construction sequence that represents the reliability may be quickly obtained through table lookup, thereby reducing the operation delay.

FIG. 1 is a schematic structural diagram of a wireless communication network 100 according to an embodiment of the present disclosure. FIG. 1 is only an example. Any other wireless network that can use the coding method or apparatus in the embodiments of the present disclosure falls within the protection scope of the present disclosure.

As shown in FIG. 1, the wireless communication network 100 includes a network device 110 and a terminal 112. When the wireless communication network 100 includes a core network 102, the network device 110 may be further connected to the core network 102. The network device 110 may further communicate with an IP network 104, for example, the Internet, a private IP network, or another data network. The network device provides a service for a terminal in coverage. For example, referring to FIG. 1, the network device 110 provides radio access for one or more terminals 112 within coverage of the network device 110. In addition, there may be an overlapping area between coverage of network devices, for example, the network device 110 and a network device 120. The network devices may further communicate with each other. For example, the network device 110 may communicate with the network device 120.

The network device may be a device configured to communicate with a terminal device. For example, the network device may be a base transceiver station (BTS) in a Global System for Mobile Communications (GSM) system or a Code Division Multiple Access (CDMA) system, may be a NodeB (NB) in a wideband CDMA (WCDMA) system, or may be an evolved NodeB (eNB or eNodeB) in an Long Term Evolution (LTE) system or a network side device in a 5G network. Alternatively, the network device may be a relay station, an access point, a vehicle-mounted device, or the like. In a device-to-device (D2D) communication system, the network device may alternatively be a terminal that functions as a base station.

The terminal may be user equipment (UE), an access terminal, a subscriber unit, a mobile station, a remote station, a remote terminal, a mobile device, a user terminal, a wireless communication device, a user agent, or a user apparatus. The access terminal may be a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, a vehicle-mounted device, a wearable device, a terminal device in a 5G network, or the like. Based on the communication system architecture shown in FIG. 1, in the embodiments of this application, the polar coding method may be performed by the foregoing network device or terminal. When the network device or the terminal serves as a transmit end to send data or information, the polar coding method may be used. Correspondingly, when the network device or the terminal serves as a receive end to receive data or information, a subchannel sequence needs to be first determined according to the method described in the present disclosure. The following describes in detail the polar coding method provided in the embodiments of this application.

Figure 2:
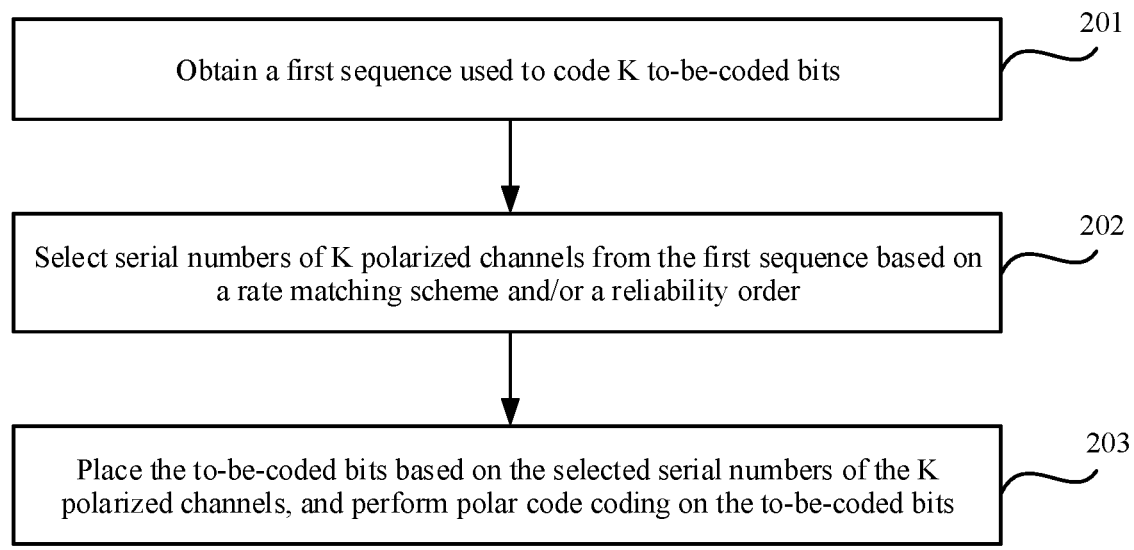
FIG. 2 is a schematic flowchart of a polar coding method according to an embodiment of this application.

Based on the communication system architecture shown in FIG. 1, as shown in FIG. 2, a specific procedure of the polar coding method provided in the embodiments of this application is described as follows.

Step 201: Obtain a first sequence used to code K to-be-coded bits.

The first sequence includes serial numbers of L polarized channels, L is a positive integer, L is equal to K or N, N is a mother code length of a polar code, $N=2^n$, n is a positive integer, K is a quantity of the to-be-coded bits, and K is less than or equal to N.

Step 202: Select serial numbers of K polarized channels from the first sequence based on a rate matching scheme and/or a reliability order. When the rate matching scheme is puncturing, selecting the serial numbers of the K polarized channels from the first sequence based on the rate matching scheme and the reliability order is selecting, from the first sequence, serial numbers of K polarized channels with highest reliability other than a polarized channel corresponding to a serial number of a punctured bit and a pre-frozen polarized channel. When the rate matching scheme is shortening, selecting the serial numbers of the K polarized channels from the first sequence based on the rate matching scheme and the reliability order is selecting, from the first sequence, serial numbers of K polarized channels with highest reliability other than a polarized channel corresponding to a shortened bit. In practice, there may be some other polarized channels that need to be pre-frozen. In this case, during selecting of polarized channels corresponding to the K information bits, these pre-frozen polarized channels do not need to be considered.

Step 203: Place the to-be-coded bits based on the selected serial numbers of the K polarized channels, and perform polar coding on the to-be-coded bits.

Optionally, the first sequence is all or a subsequence of a second sequence, where the second sequence includes serial numbers of $N_{max}$ polarized channels, the serial numbers of the $N_{max}$ polarized channels are arranged in the second sequence in ascending or descending order of reliability of the $N_{max}$ polarized channels, $N_{max}$ is a positive integer, $N_{max}$ is greater than or equal to N, and a reliability order of the serial numbers of the polarized channels in the first sequence is consistent with a reliability order of serial numbers, of polarized channels, less than N in the second sequence. Therefore, only the second sequence corresponding to $N_{max}$ may be prestored, or a plurality of possible first sequences may be prestored.

Optionally, rate matching is performed, based on a target code length, on the sequence obtained after the polar coding.

According to the coding method provided in this embodiment, after the information bits that are input are received, the quantity K of the to-be-coded bits is determined based on the target code length N of the polar code. If the second sequence is known, regardless of whether the second sequence is calculated online or pre-calculated and pre-stored, the first sequence may be obtained from the second sequence. When $N_{max}=N$, the second sequence is the first sequence. The second sequence includes a reliability order of a maximum code length $N_{max}$ of polarized channels supported by a communication system. Optionally, the first sequence may be obtained from the prestored second sequence, then the information bits are determined based on the first sequence, and finally polar coding is performed on the K to-be-coded bits, to obtain a bit sequence obtained after the polar coding. Alternatively, a plurality of possible first sequences may be directly prestored, so that a corresponding first sequence can be directly selected based on N or K. In this way, the first sequence can be determined more quickly, and sequences corresponding to N do not need to be read in a nested manner based on the sequences corresponding to $N_{max}$, thereby improving efficiency.

The following describes a sequence of serial numbers that are of polarized channels and that are obtained based on a reliability order of an $i^{th}$ polarized channel in the N (or $N_{max}$) polarized channels. The serial numbers of the N polarized channels may be 0 to (N-1), or may be 1 to N. In this embodiment of this application, during determining of the reliability of the $i^{th}$ polarized channel in the N polarized channels, a value of i may be 1, 2, . . . , or N, or may be 0, 1, . . . , or N-1.

It may be understood that the formulas in the embodiments of this application are merely examples, and all solutions obtained by persons skilled in the art based on a simple variation of the formulas without affecting performance of the formulas shall fall within the protection scope of the embodiments of this application.

For a specific example sequence, refer to the following sequences. The first sequence may be a part or all of any sequence shown in a sequence Q1 to a sequence Q6. These sequences may be represented by using corresponding tables Q1 to Q6. "Reliability or reliability serial numbers" are natural sequences with reliability in ascending order, the serial number of the polarized channel is a serial number that is of a polarized channel and that is in a corresponding sequence. The "part" herein has three different meanings:

(1) The length N of the first sequence is not 2 to the power of a positive integer, but the code lengths in the given examples are 2 to the power of a positive integer. Therefore, the first sequence can only be a part of any sequence shown in the sequence Q1 to the sequence Q6.

(2) Alternatively, if $N_{coding\ device}$ supported by a coding device is less than $N_{protocol}$ specified in a protocol, only $N_{coding\ device}$ in any sequence shown in the sequence Q1 to the sequence Q6 needs to be extracted.

(3) Alternatively, a part of an actually used sequence whose length is N is consistent with a part of any sequence shown in the sequence Q1 to the sequence Q6.

Sequence Q1: A sequence length is 1024:

[0, 1, 2, 4, 8, 16, 32, 3, 5, 64, 9, 6, 17, 10, 18, 128, 12, 33, 65, 20, 256, 34, 24, 36, 7, 129, 66, 512, 11, 40, 68, 130, 19, 13, 48, 14, 72, 257, 21, 132, 35, 258, 26, 513, 80, 37, 25, 22, 136, 260, 264, 38, 514, 96, 67, 41, 144, 28, 69, 42, 516, 49, 74, 272, 160, 520, 288, 528, 192, 544, 70, 44, 131, 81, 50, 73, 15, 320, 133, 52, 23, 134, 384, 76, 137, 82, 56, 27, 97, 39, 259, 84, 138, 145, 261, 29, 43, 98, 515, 88, 140, 30, 146, 71, 262, 265, 161, 576, 45, 100, 640, 51, 148, 46, 75, 266, 273, 517, 104, 162, 53, 193, 152, 77, 164, 768, 268, 274, 518, 54, 83, 57, 521, 112, 135, 78, 289, 194, 85, 276, 522, 58, 168, 139, 99, 86, 60, 280, 89, 290, 529, 524, 196, 141, 101, 147, 176, 142, 530, 321, 31, 200, 90, 545, 292, 322, 532, 263, 149, 102, 105, 304, 296, 163, 92, 47, 267, 385, 546, 324, 208, 386, 150, 153, 165, 106, 55, 328, 536, 577, 548, 113, 154, 79, 269, 108, 578, 224, 166, 519, 552, 195, 270, 641, 523, 275, 580, 291, 59, 169, 560, 114, 277, 156, 87, 197, 116, 170, 61, 531, 525, 642, 281, 278, 526, 177, 293, 388, 91, 584, 769, 198, 172, 120, 201, 336, 62, 282, 143, 103, 178, 294, 93, 644, 202, 592, 323, 392, 297, 770, 107, 180, 151, 209, 284, 648, 94, 204, 298, 400, 608, 352, 325, 533, 155, 210, 305, 547, 300, 109, 184, 534, 537, 115, 167, 225, 326, 306, 772, 157, 656, 329, 110, 117, 212, 171, 776, 330, 226, 549, 538, 387, 308, 216, 416, 271, 279, 158, 337, 550, 672, 118, 332, 579, 540, 389, 173, 121, 553, 199, 784, 179, 228, 338, 312, 704, 390, 174, 554, 581, 393, 283, 122, 448, 353, 561, 203, 63, 340, 394, 527, 582, 556, 181, 295, 285, 232, 124, 205, 182, 643, 562, 286, 585, 299, 354, 211, 401, 185, 396, 344, 586, 645, 593, 535, 240, 206, 95, 327, 564, 800, 402, 356, 307, 301, 417, 213, 568, 832, 588, 186, 646, 404, 227, 896, 594, 418, 302, 649, 771, 360, 539, 111, 331, 214, 309, 188, 449, 217, 408, 609, 596, 551, 650, 229, 159, 420, 310, 541, 773, 610, 657, 333, 119, 600, 339, 218, 368, 652, 230, 391, 313, 450, 542, 334, 233, 555, 774, 175, 123, 658, 612, 341, 777, 220, 314, 424, 395, 673, 583, 355, 287, 183, 234, 125, 557, 660, 616, 342, 316, 241, 778, 563, 345, 452, 397, 403, 207, 674, 558, 785, 432, 357, 187, 236, 664, 624, 587, 780, 705, 126, 242, 565, 398, 346, 456, 358, 405, 303, 569, 244, 595, 189, 566, 676, 361, 706, 589, 215, 786, 647, 348, 419, 406, 464, 680, 801, 362, 590, 409, 570, 788, 597, 572, 219, 311, 708, 598, 601, 651, 421, 792, 802, 611, 602, 410, 231, 688, 653, 248, 369, 190, 364, 654, 659, 335, 480, 315, 221, 370, 613, 422, 425, 451, 614, 543, 235, 412, 343, 372, 775, 317, 222, 426, 453, 237, 559, 833, 804, 712, 834, 661, 808, 779, 617, 604, 433, 720, 816, 836, 347, 897, 243, 662, 454, 318, 675, 618, 898, 781, 376, 428, 665, 736, 567, 840, 625, 238, 359, 457, 399, 787, 591, 678, 434, 677, 349, 245, 458, 666, 620, 363, 127, 191, 782, 407, 436, 626, 571, 465, 681, 246, 707, 350, 599, 668, 790, 460, 249, 682, 573, 411, 803, 789, 709, 365, 440, 628, 689, 374, 423, 466, 793, 250, 371, 481, 574, 413, 603, 366, 468, 655, 900, 805, 615, 684, 710, 429, 794, 252, 373, 605, 848, 690, 713, 632, 482, 806, 427, 904, 414, 223, 663, 692, 835, 619, 472, 455, 796, 809, 714, 721, 837, 716, 864, 810, 606, 912, 722, 696, 377, 435, 817, 319, 621, 812, 484, 430, 838, 667, 488, 239, 378, 459, 622, 627, 437, 380, 818, 461, 496, 669, 679, 724, 841, 629, 351, 467, 438, 737, 251, 462, 442, 441, 469, 247, 683, 842, 738, 899, 670, 783, 849, 820, 728, 928, 791, 367, 901, 630, 685, 844, 633, 711, 253, 691, 824, 902, 686, 740, 850, 375, 444, 470, 483, 415, 485, 905, 795, 473, 634, 744, 852, 960, 865, 693, 797, 906, 715, 807, 474, 636, 694, 254, 717, 575, 913, 798, 811, 379, 697, 431, 607, 489, 866, 723, 486, 908, 718, 813, 476, 856, 839, 725, 698, 914, 752, 868, 819, 814, 439, 929, 490, 623, 671, 739, 916, 463, 843, 381, 497, 930, 821, 726, 961, 872, 492, 631, 729, 700, 443, 741, 845, 920, 382, 822, 851, 730, 498, 880, 742, 445, 471, 635, 932, 687, 903, 825, 500, 846, 745, 826, 732, 446, 962, 936, 475, 853, 867, 637, 907, 487, 695, 746, 828, 753, 854, 857, 504, 799, 255, 964, 909, 719, 477, 915, 638, 748, 944, 869, 491, 699, 754, 858, 478, 968, 383, 910, 815, 976, 870, 917, 727, 493, 873, 701, 931, 756, 860, 499, 731, 823, 922, 874, 918, 502, 933, 743, 760, 881, 494, 702, 921, 501, 876, 847, 992, 447, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 919, 875, 862, 758, 948, 977, 923, 972, 761, 877, 952, 495, 703, 935, 978, 883, 762, 503, 925, 878, 735, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 959, 1011, 1013, 895, 1006, 1014, 1017, 1018, 991, 1020, 1007, 1015, 1019, 1021, 1022, 1023].

TABLE Q1

| A sequence length is 1024: | |
| --- | --- |
| Reliability or reliability serial number | Serial number of a polarized channel |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |

TABLE Q1-continued

| A sequence length is 1024: | |
| --- | --- |
| Reliability or reliability serial number | Serial number of a polarized channel |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |

TABLE Q1-continued

A sequence length is 1024:

| Reliability or reliability serial number | Serial number of a polarized channel |
| --- | --- |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |

TABLE Q1-continued

A sequence length is 1024:

| Reliability or reliability serial number | Serial number of a polarized channel |
|---|---|
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |

TABLE Q1-continued

A sequence length is 1024:

| Reliability or reliability serial number | Serial number of a polarized channel |
|---|---|
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |

TABLE Q1-continued

A sequence length is 1024:

| Reliability or reliability serial number | Serial number of a polarized channel |
|---|---|
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |

TABLE Q1-continued

A sequence length is 1024:

| Reliability or reliability serial number | Serial number of a polarized channel |
|---|---|
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |

TABLE Q1-continued

A sequence length is 1024:

| Reliability or reliability serial number | Serial number of a polarized channel |
|---|---|
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |

TABLE Q1-continued

A sequence length is 1024:

| Reliability or reliability serial number | Serial number of a polarized channel |
| --- | --- |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Q2: A sequence length is 512:
[0, 1, 2, 4, 8, 16, 32, 3, 5, 64, 9, 6, 17, 10, 18, 128, 12, 33, 65, 20, 256, 34, 24, 36, 7, 129, 66, 11, 40, 68, 130, 19, 13, 48, 14, 72, 257, 21, 132, 35, 258, 26, 80, 37, 25, 22, 136, 260, 264, 38, 96, 67, 41, 144, 28, 69, 42, 49, 74, 272, 160, 288, 192, 70, 44, 131, 81, 50, 73, 15, 320, 133, 52, 23, 134, 384, 76, 137, 82, 56, 27, 97, 39, 259, 84, 138, 145, 261, 29, 43, 98, 88, 140, 30, 146, 71, 262, 265, 161, 45, 100, 51, 148, 46, 75, 266, 273, 104, 162, 53, 193, 152, 77, 164, 268, 274, 54, 83, 57, 112, 135, 78, 289, 194, 85, 276, 58, 168, 139, 99, 86, 60, 280, 89, 290, 196, 141, 101, 147, 176, 142, 321, 31, 200, 90, 292, 322, 263, 149, 102, 105, 304, 296, 163, 92, 47, 267, 385, 324, 208, 386, 150, 153, 165, 106, 55, 328, 113, 154, 79, 269, 108, 224, 166, 195, 270, 275, 291, 59, 169, 114, 277, 156, 87, 197, 116, 170, 61, 281, 278, 177, 293, 388, 91, 198, 172, 120, 201, 336, 62, 282, 143, 103, 178, 294, 93, 202, 323, 392, 297, 107, 180, 151, 209, 284, 94, 204, 298, 400, 352, 325, 155, 210, 305, 300, 109, 184, 115, 167, 225, 326, 306, 157, 329, 110, 117, 212, 171, 330, 226, 387, 308, 216, 416, 271, 279, 158, 337, 118, 332, 389, 173, 121, 199, 179, 228, 338, 312, 390, 174, 393, 283, 122, 448, 353, 203, 63, 340, 394, 181, 295, 285, 232, 124, 205, 182, 286, 299, 354, 211, 401, 185, 396, 344, 240, 206, 95, 327, 402, 356, 307, 301, 417, 213, 186, 404, 227, 418, 302, 360, 111, 331, 214, 309, 188, 449, 217, 408, 229, 159, 420, 310, 333, 119, 339, 218, 368, 230, 391, 313, 450, 334, 233, 175, 123, 341, 220, 314, 424, 395, 355, 287, 183, 234, 125, 342, 316, 241, 345, 452, 397, 403, 207, 432, 357, 187, 236, 126, 242, 398, 346, 456, 358, 405, 303, 244, 189, 361, 215, 348, 419, 406, 464, 362, 409, 219, 311, 421, 410, 231, 248, 369, 190, 364, 335, 480, 315, 221, 370, 422, 425, 451, 235, 412, 343, 372, 317, 222, 426, 453, 237, 433, 347, 243, 454, 318, 376, 428, 238, 359, 457, 399, 434, 349, 245, 458, 363, 127, 191, 407, 436, 465, 246, 350, 460, 249, 411, 365, 440, 374, 423, 466, 250, 371, 481, 413, 366, 468, 429, 252, 373, 482, 427, 414, 223, 472, 455, 377, 435, 319, 484, 430, 488, 239, 378, 459, 437, 380, 461, 496, 351, 467, 438, 251, 462, 442, 441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511]

TABLE Q2

A sequence length is 512:

| Reliability or reliability serial number | Serial number of a polarized channel |
| --- | --- |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 11 |
| 28 | 40 |
| 29 | 68 |
| 30 | 130 |
| 31 | 19 |
| 32 | 13 |
| 33 | 48 |
| 34 | 14 |
| 35 | 72 |
| 36 | 257 |
| 37 | 21 |
| 38 | 132 |
| 39 | 35 |
| 40 | 258 |
| 41 | 26 |
| 42 | 80 |
| 43 | 37 |
| 44 | 25 |
| 45 | 22 |
| 46 | 136 |
| 47 | 260 |
| 48 | 264 |
| 49 | 38 |
| 50 | 96 |
| 51 | 67 |
| 52 | 41 |
| 53 | 144 |
| 54 | 28 |
| 55 | 69 |
| 56 | 42 |
| 57 | 49 |
| 58 | 74 |
| 59 | 272 |
| 60 | 160 |
| 61 | 288 |

TABLE Q2-continued

A sequence length is 512:

| Reliability or reliability serial number | Serial number of a polarized channel |
|---|---|
| 62 | 192 |
| 63 | 70 |
| 64 | 44 |
| 65 | 131 |
| 66 | 81 |
| 67 | 50 |
| 68 | 73 |
| 69 | 15 |
| 70 | 320 |
| 71 | 133 |
| 72 | 52 |
| 73 | 23 |
| 74 | 134 |
| 75 | 384 |
| 76 | 76 |
| 77 | 137 |
| 78 | 82 |
| 79 | 56 |
| 80 | 27 |
| 81 | 97 |
| 82 | 39 |
| 83 | 259 |
| 84 | 84 |
| 85 | 138 |
| 86 | 145 |
| 87 | 261 |
| 88 | 29 |
| 89 | 43 |
| 90 | 98 |
| 91 | 88 |
| 92 | 140 |
| 93 | 30 |
| 94 | 146 |
| 95 | 71 |
| 96 | 262 |
| 97 | 265 |
| 98 | 161 |
| 99 | 45 |
| 100 | 100 |
| 101 | 51 |
| 102 | 148 |
| 103 | 46 |
| 104 | 75 |
| 105 | 266 |
| 106 | 273 |
| 107 | 104 |
| 108 | 162 |
| 109 | 53 |
| 110 | 193 |
| 111 | 152 |
| 112 | 77 |
| 113 | 164 |
| 114 | 268 |
| 115 | 274 |
| 116 | 54 |
| 117 | 83 |
| 118 | 57 |
| 119 | 112 |
| 120 | 135 |
| 121 | 78 |
| 122 | 289 |
| 123 | 194 |
| 124 | 85 |
| 125 | 276 |
| 126 | 58 |
| 127 | 168 |
| 128 | 139 |
| 129 | 99 |
| 130 | 86 |
| 131 | 60 |
| 132 | 280 |
| 133 | 89 |
| 134 | 290 |
| 135 | 196 |
| 136 | 141 |
| 137 | 101 |
| 138 | 147 |
| 139 | 176 |
| 140 | 142 |
| 141 | 321 |
| 142 | 31 |
| 143 | 200 |
| 144 | 90 |
| 145 | 292 |
| 146 | 322 |
| 147 | 263 |
| 148 | 149 |
| 149 | 102 |
| 150 | 105 |
| 151 | 304 |
| 152 | 296 |
| 153 | 163 |
| 154 | 92 |
| 155 | 47 |
| 156 | 267 |
| 157 | 385 |
| 158 | 324 |
| 159 | 208 |
| 160 | 386 |
| 161 | 150 |
| 162 | 153 |
| 163 | 165 |
| 164 | 106 |
| 165 | 55 |
| 166 | 328 |
| 167 | 113 |
| 168 | 154 |
| 169 | 79 |
| 170 | 269 |
| 171 | 108 |
| 172 | 224 |
| 173 | 166 |
| 174 | 195 |
| 175 | 270 |
| 176 | 275 |
| 177 | 291 |
| 178 | 59 |
| 179 | 169 |
| 180 | 114 |
| 181 | 277 |
| 182 | 156 |
| 183 | 87 |
| 184 | 197 |
| 185 | 116 |
| 186 | 170 |
| 187 | 61 |
| 188 | 281 |
| 189 | 278 |
| 190 | 177 |
| 191 | 293 |
| 192 | 388 |
| 193 | 91 |
| 194 | 198 |
| 195 | 172 |
| 196 | 120 |
| 197 | 201 |
| 198 | 336 |
| 199 | 62 |
| 200 | 282 |
| 201 | 143 |
| 202 | 103 |
| 203 | 178 |
| 204 | 294 |
| 205 | 93 |
| 206 | 202 |
| 207 | 323 |

TABLE Q2-continued

A sequence length is 512:

| Reliability or reliability serial number | Serial number of a polarized channel |
|---|---|
| 208 | 392 |
| 209 | 297 |
| 210 | 107 |
| 211 | 180 |
| 212 | 151 |
| 213 | 209 |
| 214 | 284 |
| 215 | 94 |
| 216 | 204 |
| 217 | 298 |
| 218 | 400 |
| 219 | 352 |
| 220 | 325 |
| 221 | 155 |
| 222 | 210 |
| 223 | 305 |
| 224 | 300 |
| 225 | 109 |
| 226 | 184 |
| 227 | 115 |
| 228 | 167 |
| 229 | 225 |
| 230 | 326 |
| 231 | 306 |
| 232 | 157 |
| 233 | 329 |
| 234 | 110 |
| 235 | 117 |
| 236 | 212 |
| 237 | 171 |
| 238 | 330 |
| 239 | 226 |
| 240 | 387 |
| 241 | 308 |
| 242 | 216 |
| 243 | 416 |
| 244 | 271 |
| 245 | 279 |
| 246 | 158 |
| 247 | 337 |
| 248 | 118 |
| 249 | 332 |
| 250 | 389 |
| 251 | 173 |
| 252 | 121 |
| 253 | 199 |
| 254 | 179 |
| 255 | 228 |
| 256 | 338 |
| 257 | 312 |
| 258 | 390 |
| 259 | 174 |
| 260 | 393 |
| 261 | 283 |
| 262 | 122 |
| 263 | 448 |
| 264 | 353 |
| 265 | 203 |
| 266 | 63 |
| 267 | 340 |
| 268 | 394 |
| 269 | 181 |
| 270 | 295 |
| 271 | 285 |
| 272 | 232 |
| 273 | 124 |
| 274 | 205 |
| 275 | 182 |
| 276 | 286 |
| 277 | 299 |
| 278 | 354 |
| 279 | 211 |
| 280 | 401 |
| 281 | 185 |
| 282 | 396 |
| 283 | 344 |
| 284 | 240 |
| 285 | 206 |
| 286 | 95 |
| 287 | 327 |
| 288 | 402 |
| 289 | 356 |
| 290 | 307 |
| 291 | 301 |
| 292 | 417 |
| 293 | 213 |
| 294 | 186 |
| 295 | 404 |
| 296 | 227 |
| 297 | 418 |
| 298 | 302 |
| 299 | 360 |
| 300 | 111 |
| 301 | 331 |
| 302 | 214 |
| 303 | 309 |
| 304 | 188 |
| 305 | 449 |
| 306 | 217 |
| 307 | 408 |
| 308 | 229 |
| 309 | 159 |
| 310 | 420 |
| 311 | 310 |
| 312 | 333 |
| 313 | 119 |
| 314 | 339 |
| 315 | 218 |
| 316 | 368 |
| 317 | 230 |
| 318 | 391 |
| 319 | 313 |
| 320 | 450 |
| 321 | 334 |
| 322 | 233 |
| 323 | 175 |
| 324 | 123 |
| 325 | 341 |
| 326 | 220 |
| 327 | 314 |
| 328 | 424 |
| 329 | 395 |
| 330 | 355 |
| 331 | 287 |
| 332 | 183 |
| 333 | 234 |
| 334 | 125 |
| 335 | 342 |
| 336 | 316 |
| 337 | 241 |
| 338 | 345 |
| 339 | 452 |
| 340 | 397 |
| 341 | 403 |
| 342 | 207 |
| 343 | 432 |
| 344 | 357 |
| 345 | 187 |
| 346 | 236 |
| 347 | 126 |
| 348 | 242 |
| 349 | 398 |
| 350 | 346 |
| 351 | 456 |
| 352 | 358 |
| 353 | 405 |

TABLE Q2-continued

A sequence length is 512:

| Reliability or reliability serial number | Serial number of a polarized channel |
|---|---|
| 354 | 303 |
| 355 | 244 |
| 356 | 189 |
| 357 | 361 |
| 358 | 215 |
| 359 | 348 |
| 360 | 419 |
| 361 | 406 |
| 362 | 464 |
| 363 | 362 |
| 364 | 409 |
| 365 | 219 |
| 366 | 311 |
| 367 | 421 |
| 368 | 410 |
| 369 | 231 |
| 370 | 248 |
| 371 | 369 |
| 372 | 190 |
| 373 | 364 |
| 374 | 335 |
| 375 | 480 |
| 376 | 315 |
| 377 | 221 |
| 378 | 370 |
| 379 | 422 |
| 380 | 425 |
| 381 | 451 |
| 382 | 235 |
| 383 | 412 |
| 384 | 343 |
| 385 | 372 |
| 386 | 317 |
| 387 | 222 |
| 388 | 426 |
| 389 | 453 |
| 390 | 237 |
| 391 | 433 |
| 392 | 347 |
| 393 | 243 |
| 394 | 454 |
| 395 | 318 |
| 396 | 376 |
| 397 | 428 |
| 398 | 238 |
| 399 | 359 |
| 400 | 457 |
| 401 | 399 |
| 402 | 434 |
| 403 | 349 |
| 404 | 245 |
| 405 | 458 |
| 406 | 363 |
| 407 | 127 |
| 408 | 191 |
| 409 | 407 |
| 410 | 436 |
| 411 | 465 |
| 412 | 246 |
| 413 | 350 |
| 414 | 460 |
| 415 | 249 |
| 416 | 411 |
| 417 | 365 |
| 418 | 440 |
| 419 | 374 |
| 420 | 423 |
| 421 | 466 |
| 422 | 250 |
| 423 | 371 |
| 424 | 481 |
| 425 | 413 |
| 426 | 366 |
| 427 | 468 |
| 428 | 429 |
| 429 | 252 |
| 430 | 373 |
| 431 | 482 |
| 432 | 427 |
| 433 | 414 |
| 434 | 223 |
| 435 | 472 |
| 436 | 455 |
| 437 | 377 |
| 438 | 435 |
| 439 | 319 |
| 440 | 484 |
| 441 | 430 |
| 442 | 488 |
| 443 | 239 |
| 444 | 378 |
| 445 | 459 |
| 446 | 437 |
| 447 | 380 |
| 448 | 461 |
| 449 | 496 |
| 450 | 351 |
| 451 | 467 |
| 452 | 438 |
| 453 | 251 |
| 454 | 462 |
| 455 | 442 |
| 456 | 441 |
| 457 | 469 |
| 458 | 247 |
| 459 | 367 |
| 460 | 253 |
| 461 | 375 |
| 462 | 444 |
| 463 | 470 |
| 464 | 483 |
| 465 | 415 |
| 466 | 485 |
| 467 | 473 |
| 468 | 474 |
| 469 | 254 |
| 470 | 379 |
| 471 | 431 |
| 472 | 489 |
| 473 | 486 |
| 474 | 476 |
| 475 | 439 |
| 476 | 490 |
| 477 | 463 |
| 478 | 381 |
| 479 | 497 |
| 480 | 492 |
| 481 | 443 |
| 482 | 382 |
| 483 | 498 |
| 484 | 445 |
| 485 | 471 |
| 486 | 500 |
| 487 | 446 |
| 488 | 475 |
| 489 | 487 |
| 490 | 504 |
| 491 | 255 |
| 492 | 477 |
| 493 | 491 |
| 494 | 478 |
| 495 | 383 |
| 496 | 493 |
| 497 | 499 |
| 498 | 502 |
| 499 | 494 |

TABLE Q2-continued

A sequence length is 512:

| Reliability or reliability serial number | Serial number of a polarized channel |
|---|---|
| 500 | 501 |
| 501 | 447 |
| 502 | 505 |
| 503 | 506 |
| 504 | 479 |
| 505 | 508 |
| 506 | 495 |
| 507 | 503 |
| 508 | 507 |
| 509 | 509 |
| 510 | 510 |
| 511 | 511 |

Sequence Q3: A sequence length is 256:
[0, 1, 2, 4, 8, 16, 32, 3, 5, 64, 9, 6, 17, 10, 18, 128, 12, 33, 65, 20, 34, 24, 36, 7, 129, 66, 11, 40, 68, 130, 19, 13, 48, 14, 72, 21, 132, 35, 26, 80, 37, 25, 22, 136, 38, 96, 67, 41, 144, 28, 69, 42, 49, 74, 160, 192, 70, 44, 131, 81, 50, 73, 15, 133, 52, 23, 134, 76, 137, 82, 56, 27, 97, 39, 84, 138, 145, 29, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 139, 99, 86, 60, 89, 196, 141, 101, 147, 176, 142, 31, 200, 90, 149, 102, 105, 163, 92, 47, 208, 150, 153, 165, 106, 55, 113, 154, 79, 108, 224, 166, 195, 59, 169, 114, 156, 87, 197, 116, 170, 61, 177, 91, 198, 172, 120, 201, 62, 143, 103, 178, 93, 202, 107, 180, 151, 209, 94, 204, 155, 210, 109, 184, 115, 167, 225, 157, 110, 117, 212, 171, 226, 216, 158, 118, 173, 121, 199, 179, 228, 174, 122, 203, 63, 181, 232, 124, 205, 182, 211, 185, 240, 206, 95, 213, 186, 227, 111, 214, 188, 217, 229, 159, 119, 218, 230, 233, 175, 123, 220, 183, 234, 125, 241, 207, 187, 236, 126, 242, 244, 189, 215, 219, 231, 248, 190, 221, 235, 222, 237, 243, 238, 245, 127, 191, 246, 249, 250, 252, 223, 239, 251, 247, 253, 254, 255]

TABLE Q3

A sequence length is 256:

| Reliability or reliability serial number | Serial number of a polarized channel |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 34 |
| 21 | 24 |

TABLE Q3-continued

A sequence length is 256:

| Reliability or reliability serial number | Serial number of a polarized channel |
|---|---|
| 22 | 36 |
| 23 | 7 |
| 24 | 129 |
| 25 | 66 |
| 26 | 11 |
| 27 | 40 |
| 28 | 68 |
| 29 | 130 |
| 30 | 19 |
| 31 | 13 |
| 32 | 48 |
| 33 | 14 |
| 34 | 72 |
| 35 | 21 |
| 36 | 132 |
| 37 | 35 |
| 38 | 26 |
| 39 | 80 |
| 40 | 37 |
| 41 | 25 |
| 42 | 22 |
| 43 | 136 |
| 44 | 38 |
| 45 | 96 |
| 46 | 67 |
| 47 | 41 |
| 48 | 144 |
| 49 | 28 |
| 50 | 69 |
| 51 | 42 |
| 52 | 49 |
| 53 | 74 |
| 54 | 160 |
| 55 | 192 |
| 56 | 70 |
| 57 | 44 |
| 58 | 131 |
| 59 | 81 |
| 60 | 50 |
| 61 | 73 |
| 62 | 15 |
| 63 | 133 |
| 64 | 52 |
| 65 | 23 |
| 66 | 134 |
| 67 | 76 |
| 68 | 137 |
| 69 | 82 |
| 70 | 56 |
| 71 | 27 |
| 72 | 97 |
| 73 | 39 |
| 74 | 84 |
| 75 | 138 |
| 76 | 145 |
| 77 | 29 |
| 78 | 43 |
| 79 | 98 |
| 80 | 88 |
| 81 | 140 |
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |

TABLE Q3-continued

A sequence length is 256:

| Reliability or reliability serial number | Serial number of a polarized channel |
|---|---|
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 31 |
| 121 | 200 |
| 122 | 90 |
| 123 | 149 |
| 124 | 102 |
| 125 | 105 |
| 126 | 163 |
| 127 | 92 |
| 128 | 47 |
| 129 | 208 |
| 130 | 150 |
| 131 | 153 |
| 132 | 165 |
| 133 | 106 |
| 134 | 55 |
| 135 | 113 |
| 136 | 154 |
| 137 | 79 |
| 138 | 108 |
| 139 | 224 |
| 140 | 166 |
| 141 | 195 |
| 142 | 59 |
| 143 | 169 |
| 144 | 114 |
| 145 | 156 |
| 146 | 87 |
| 147 | 197 |
| 148 | 116 |
| 149 | 170 |
| 150 | 61 |
| 151 | 177 |
| 152 | 91 |
| 153 | 198 |
| 154 | 172 |
| 155 | 120 |
| 156 | 201 |
| 157 | 62 |
| 158 | 143 |
| 159 | 103 |
| 160 | 178 |
| 161 | 93 |
| 162 | 202 |
| 163 | 107 |
| 164 | 180 |
| 165 | 151 |
| 166 | 209 |
| 167 | 94 |
| 168 | 204 |
| 169 | 155 |
| 170 | 210 |
| 171 | 109 |
| 172 | 184 |
| 173 | 115 |
| 174 | 167 |
| 175 | 225 |
| 176 | 157 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 174 |
| 191 | 122 |
| 192 | 203 |
| 193 | 63 |
| 194 | 181 |
| 195 | 232 |
| 196 | 124 |
| 197 | 205 |
| 198 | 182 |
| 199 | 211 |
| 200 | 185 |
| 201 | 240 |
| 202 | 206 |
| 203 | 95 |
| 204 | 213 |
| 205 | 186 |
| 206 | 227 |
| 207 | 111 |
| 208 | 214 |
| 209 | 188 |
| 210 | 217 |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |
| 224 | 207 |
| 225 | 187 |
| 226 | 236 |
| 227 | 126 |
| 228 | 242 |
| 229 | 244 |
| 230 | 189 |
| 231 | 215 |
| 232 | 219 |
| 233 | 231 |
| 234 | 248 |
| 235 | 190 |
| 236 | 221 |
| 237 | 235 |
| 238 | 222 |
| 239 | 237 |
| 240 | 243 |

TABLE Q3-continued

A sequence length is 256:

| Reliability or reliability serial number | Serial number of a polarized channel |
|---|---|
| 241 | 238 |
| 242 | 245 |
| 243 | 127 |
| 244 | 191 |
| 245 | 246 |
| 246 | 249 |
| 247 | 250 |
| 248 | 252 |
| 249 | 223 |
| 250 | 239 |
| 251 | 251 |
| 252 | 247 |
| 253 | 253 |
| 254 | 254 |
| 255 | 255 |

Sequence Q4: A sequence length is 128:
[0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 26, 80, 37, 25, 22, 38, 96, 67, 41, 28, 69, 42, 49, 74, 70, 44, 81, 50, 73, 15, 52, 23, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 127]

TABLE Q4

A sequence length is 128:

| Reliability or reliability serial number | Serial number of a polarized channel |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 65 |
| 18 | 20 |
| 19 | 34 |
| 20 | 24 |
| 21 | 36 |
| 22 | 7 |
| 23 | 66 |
| 24 | 11 |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 38 |
| 40 | 96 |
| 41 | 67 |
| 42 | 41 |
| 43 | 28 |
| 44 | 69 |
| 45 | 42 |
| 46 | 49 |
| 47 | 74 |
| 48 | 70 |
| 49 | 44 |
| 50 | 81 |
| 51 | 50 |
| 52 | 73 |
| 53 | 15 |
| 54 | 52 |
| 55 | 23 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 31 |
| 90 | 90 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |

TABLE Q4-continued

A sequence length is 128:

| Reliability or reliability serial number | Serial number of a polarized channel |
|---|---|
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q5: A sequence length is 64:

[0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 58, 60, 31, 47, 55, 59, 61, 62, 63]

TABLE Q5

A sequence length is 64:

| Reliability or reliability serial number | Serial number of a polarized channel |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 9 |
| 10 | 6 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |
| 26 | 14 |
| 27 | 21 |
| 28 | 35 |
| 29 | 26 |
| 30 | 37 |
| 31 | 25 |

TABLE Q5-continued

A sequence length is 64:

| Reliability or reliability serial number | Serial number of a polarized channel |
|---|---|
| 32 | 22 |
| 33 | 38 |
| 34 | 41 |
| 35 | 28 |
| 36 | 42 |
| 37 | 49 |
| 38 | 44 |
| 39 | 50 |
| 40 | 15 |
| 41 | 52 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Q6: A sequence length is 32:

[0, 1, 2, 4, 8, 16, 3, 5, 9, 6, 17, 10, 18, 12, 20, 24, 7, 11, 19, 13, 14, 21, 26, 25, 22, 28, 15, 23, 27, 29, 30, 31].

TABLE Q6

A sequence length is 32:

| Reliability or reliability serial number | Serial number of a polarized channel |
|---|---|
| 0 | 0 |
| 1 | 1 |
| 2 | 2 |
| 3 | 4 |
| 4 | 8 |
| 5 | 16 |
| 6 | 3 |
| 7 | 5 |
| 8 | 9 |
| 9 | 6 |
| 10 | 17 |
| 11 | 10 |
| 12 | 18 |
| 13 | 12 |
| 14 | 20 |
| 15 | 24 |
| 16 | 7 |
| 17 | 11 |
| 18 | 19 |
| 19 | 13 |
| 20 | 14 |
| 21 | 21 |
| 22 | 26 |
| 23 | 25 |
| 24 | 22 |

TABLE Q6-continued

A sequence length is 32:

| Reliability or reliability serial number | Serial number of a polarized channel |
|---|---|
| 25 | 28 |
| 26 | 15 |
| 27 | 23 |
| 28 | 27 |
| 29 | 29 |
| 30 | 30 |
| 31 | 31 |

It should be noted that the foregoing some sequences are merely some examples, and application of the sequences to a polar coding process helps improve polar coding/decoding performance. In any example sequence, on the premise that an overall effect of the sequence is not affected, adjustment or equivalent replacement including but not limited to the following aspects may be performed:

1. Locations of a few elements in the sequence are exchanged. For example, a location of a serial number may be adjusted within a specified amplitude. For example, the specified amplitude is 5, and a location of an element whose serial number is 10 may be adjusted within a range from five locations on the left of the element to five locations on the right of the element.

2. Some elements in the sequence are adjusted, but channel sets that are used to transmit T-bit information and that are selected based on the sequence are consistent or similar.

3. The sequence includes N elements starting from 0 to N−1, and the N elements starting from 0 to N−1 represent the serial numbers of the N polarized channels. Actually, the serial numbers of the N polarized channels may alternatively start from 1 to N. That is, 1 is added to each serial number in the foregoing sequence. This is also a serial number form in the foregoing calculation manners. Certainly, the serial number or an identifier of the polarized channel may alternatively be indicated in another manner. The specific expression manner does not affect a specific location that is of the polarized channel and that is indicated in the sequence.

4. The serial numbers of the N polarized channels in the foregoing sequence are arranged in ascending order of the reliability of the N polarized channels. In this case, selecting the K polarized channels in descending order of the reliability based on the rate matching scheme is: when the rate matching scheme is puncturing, selecting polarized channels corresponding to the last K serial numbers other than a polarized channel corresponding to a serial number of a punctured bit and a pre-frozen polarized channel; and when the rate matching scheme is shortening, selecting polarized channels corresponding to the last K serial numbers other than a polarized channel corresponding to a serial number of a shortened bit. Actually, the serial numbers of the N polarized channels may alternatively be arranged in descending order of the reliability of the N polarized channels. That is, elements in the foregoing sequence are arranged in a reverse order. In this case, selecting the K polarized channels in descending order of the reliability based on the rate matching scheme is: when the rate matching scheme is puncturing, selecting polarized channels corresponding to the first K serial numbers other than a polarized channel corresponding to a serial number of a punctured bit and a pre-frozen polarized channel; and when the rate matching scheme is shortening, selecting polarized channels corresponding to the first K serial numbers other than a polarized channel corresponding to a serial number of a shortened bit.

5. Alternatively, the foregoing sequence may be represented by using a sequence of normalized reliability or equivalent reliability of various channels. For example, if an order location of a channel x in the foregoing sequence is n (a leftmost location is denoted as 1), reliability of the channel may be represented as n or normalized n/N, where N is a length of the sequence.

During actual application, a sequence or a table corresponding to $N_{max}$ may be stored only based on $N_{max}$, that is, $L=N_{max}$, or a plurality of sequences or tables corresponding to N may be stored based on all supported different values of N, that is, L=N. Further, alternatively, a part of a plurality of sequences or tables corresponding to N may be stored based on all supported different values of N, that is, L<N. The serial numbers of the N polarized channels in the stored sequences or tables are arranged in ascending or descending order of the reliability of the N polarized channels. The serial numbers include N elements starting from 0 to N−1, and the N elements starting from 0 to N−1 represent the serial numbers of the N polarized channels. Actually, the serial numbers of the N polarized channels may alternatively start from 1 to N.

Further, a quantity of to-be-coded information bits used for polar coding of a physical broadcast channel (PBCH) is 56. Because this value basically remains unchanged, and a corresponding bit rate also remains unchanged, a corresponding mother code length, a corresponding rate matching manner, and the like basically remain unchanged. Therefore, only serial numbers that are of polarized channels and that correspond to the 56 to-be-coded information bits may be stored, that is, a length L of the first sequence is equal to K, and is set to 56. In this case, when the first sequence is arranged in ascending order of reliability and the corresponding serial numbers of the polarized channels start from 0, the stored first sequence is [441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511]. It should be noted that, the foregoing sequence may be alternatively stored as [247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511] in a natural order. Polarized channels whose serial numbers are [446, 478, 487, 490, 491, 492, 493, 494, 495, 497, 498, 499, 500, 501, 502, 503, 504, 505, 506, 507, 508, 509, 510, 511] are used to place CRC bits. Specific elements/fields on the PBCH are arranged in a manner specified in a protocol or in any other manner agreed on by the transmit end and the receive end. Certainly, with development of wireless communications standards, if the quantity of the to-be-coded information bits included in the PBCH changes, the stored first sequence also changes correspondingly.

Figure 3:
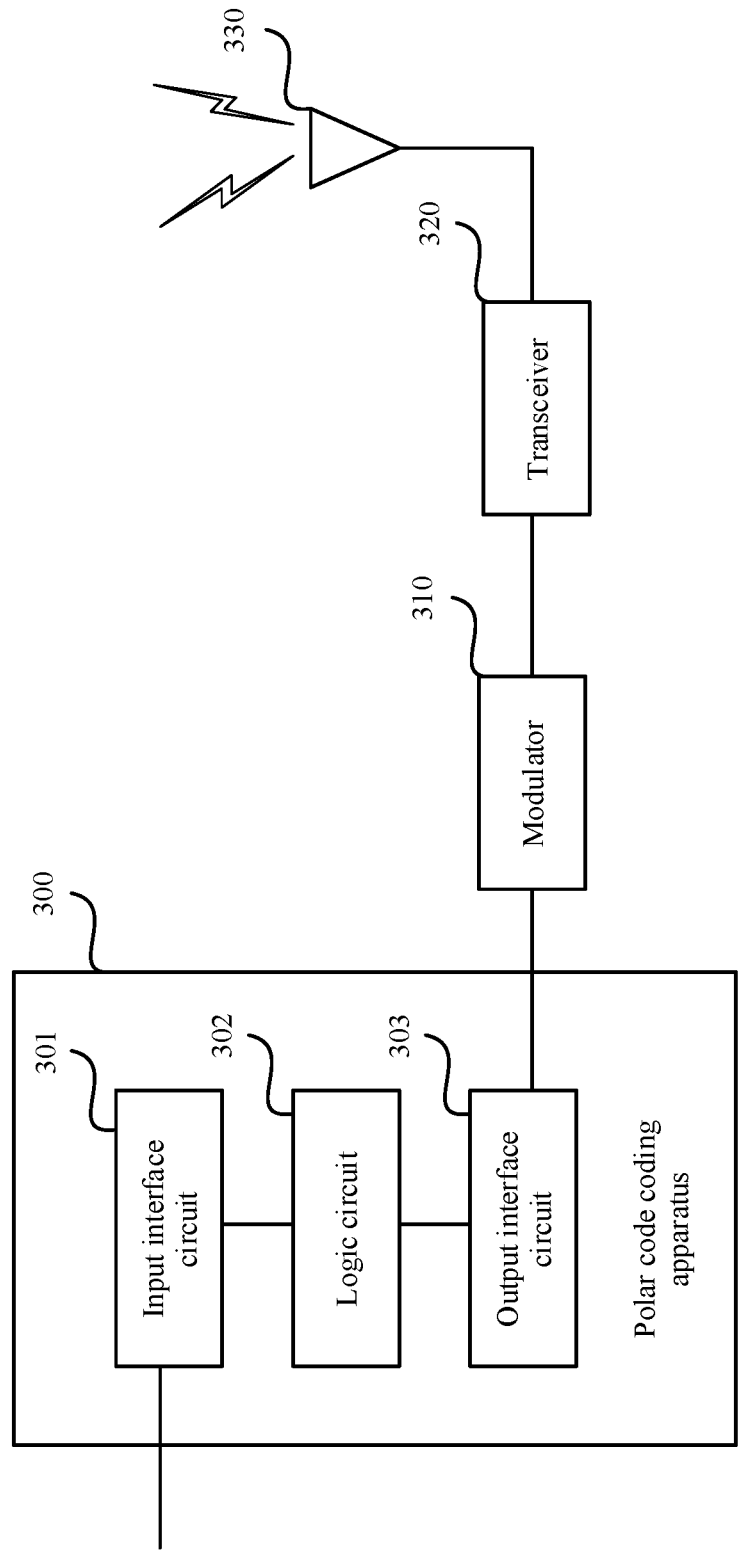
FIG. 3 is a first schematic structural diagram of a polar coding apparatus according to an embodiment of this application.

Based on a same inventive concept as the polar coding method shown in FIG. 2, as shown in FIG. 3, an embodiment of this application further provides a polar coding apparatus 300. The polar coding apparatus 300 is configured to perform the polar coding method shown in FIG. 2. A part or all of the polar coding method shown in FIG. 2 may be implemented by hardware or software. When the polar coding method is implemented by hardware, the polar coding apparatus 300 includes: an input interface circuit 301, configured to obtain to-be-coded bits; a logic circuit 302, configured to perform the polar coding method shown in FIG. 2, where for details, refer to the descriptions in the foregoing method embodiment, and details are not described herein again; and an output interface circuit 303, configured to output a coded bit sequence.

Further, the coded bit sequence output by the coding apparatus 300 is modulated by a modulator 310 and then output to a transceiver 320. The transceiver 320 performs corresponding processing (including but not limited to processing such as digital-to-analog conversion and/or frequency conversion) on the modulated sequence, and then sends the modulated sequence by using an antenna 330.

Optionally, in a specific implementation, the polar coding apparatus 300 may be a chip or an integrated circuit.

Figure 4:
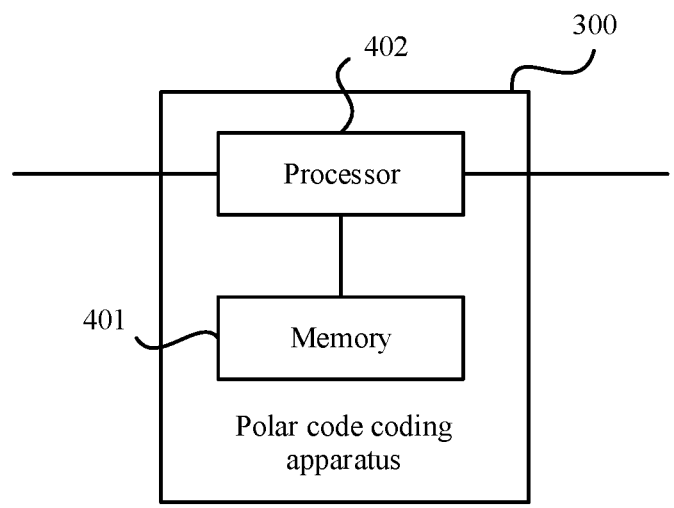
FIG. 4 is a second schematic structural diagram of a polar coding apparatus according to an embodiment of this application.

Optionally, when a part or all of the polar coding method in the foregoing embodiment is implemented by software, as shown in FIG. 4, the polar coding apparatus 300 includes: at least one memory 401, configured to store a program; and at least one processor 402, configured to execute the program stored in the memory 401, so that when the program is executed, the polar coding apparatus 300 can implement the polar coding method provided in the embodiment in FIG. 2.

Figure 5:
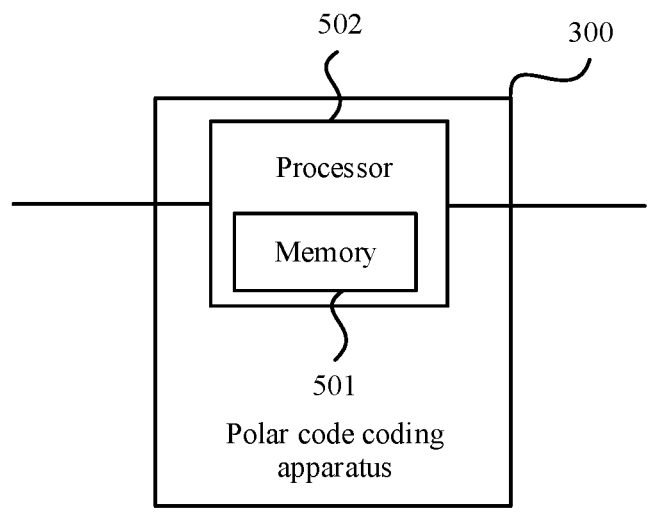
FIG. 5 is a third schematic structural diagram of a polar coding apparatus according to an embodiment of this application.

Optionally, the memory 401 may be a physically independent unit. Alternatively, as shown in FIG. 5, a memory 501 is integrated with a processor 502.

Optionally, when a part or all of the coding method in the embodiment in FIG. 2 is implemented by software, the polar coding apparatus 300 may alternatively include only a processor 402. A memory 401 configured to store a program is located outside the polar coding apparatus 300. The processor 402 is connected to the memory 401 by using a circuit/wire, and is configured to read and execute the program stored in the memory 401.

The processor 402 may be a central processing unit (CPU), a network processor (NP), or a combination of a CPU and an NP.

The processor 402 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory in the foregoing embodiments may include a volatile memory, for example, a random access memory (RAM). The memory may alternatively include a non-volatile memory, for example, a flash memory, a hard disk drive (HDD), or a solid-state drive (SSD). The memory may further include a combination of the foregoing types of memories.

Figure 6:
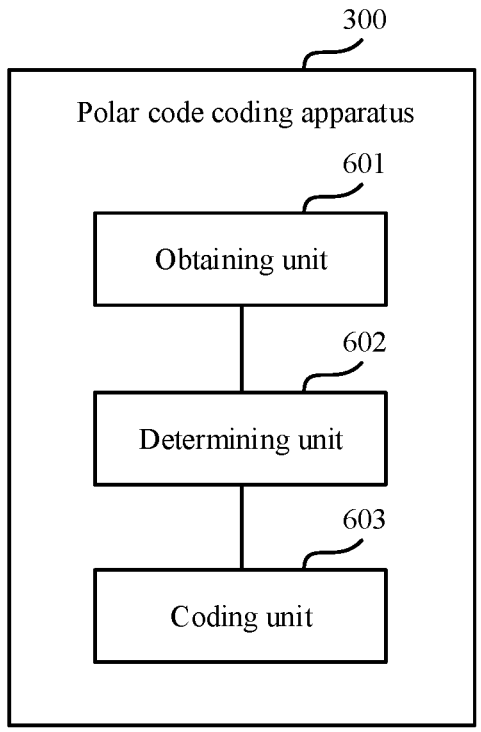
FIG. 6 is a fourth schematic structural diagram of a polar coding apparatus according to an embodiment of this application.

Based on the polar coding method shown in FIG. 2, as shown in FIG. 6, an embodiment of this application further provides a polar coding apparatus 300. The polar coding apparatus 300 is configured to perform the polar coding method shown in FIG. 2. The polar coding apparatus 300 includes:

an obtaining unit 601, configured to obtain a first sequence used to code K to-be-coded bits, where the first sequence includes serial numbers of L polarized channels, L is a positive integer, L is equal to K or N, N is a mother code length of a polar code, $N=2^n$, n is a positive integer, K is a quantity of the to-be-coded bits, and K is less than or equal to N;

a determining unit 602, configured to determine serial numbers of K polarized channels in the first sequence based on a rate matching scheme and/or a reliability order; and a coding unit 603, configured to: place the to-be-coded bits based on the selected serial numbers of the K polarized channels, and perform polar coding on the to-be-coded bits.

The first sequence may be any one of the foregoing example sequences, or may be obtained by extracting serial numbers (where the serial numbers start from 0) less than N from a second sequence with a length of $N_{max}$. Alternatively, reliability of an $i^{th}$ polarized channel in N polarized channels may be determined by using any one of the foregoing example formulas.

An embodiment of this application further provides a computer storage medium. The computer storage medium stores a computer program, and the computer program is configured to perform the polar coding method shown in FIG. 2.

An embodiment of this application further provides a computer program product including instructions. When the computer program product runs on a computer, the computer is enabled to perform the polar coding method shown in FIG. 2.

Figure 7:
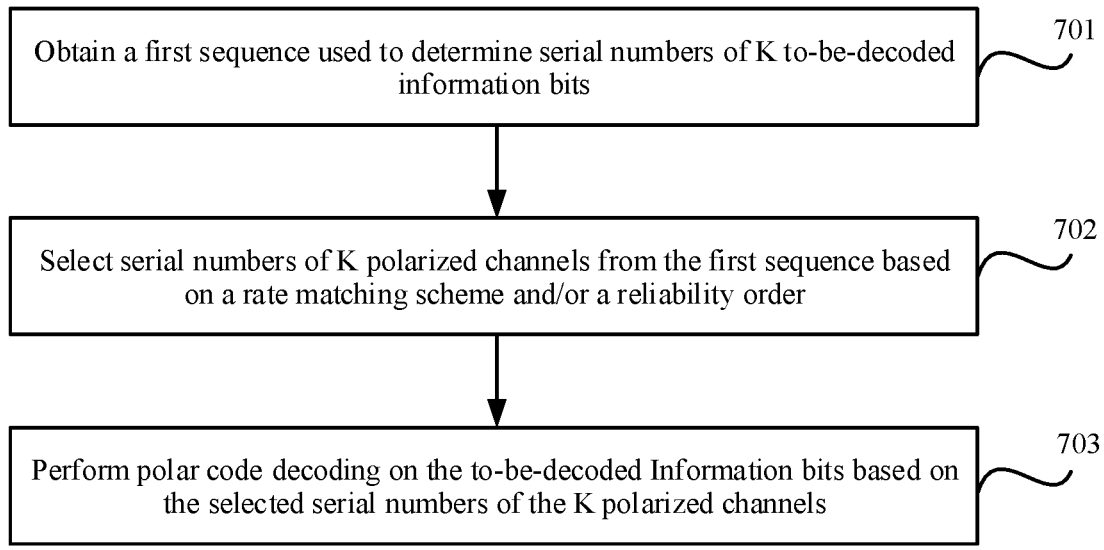
FIG. 7 is a schematic flowchart of a polar code decoding method according to an embodiment of this application.

Based on the communication system architecture shown in FIG. 1, as shown in FIG. 7, an embodiment of this application further provides a polar code decoding method. A specific procedure is as follows.

Step 701: Obtain a first sequence used to determine serial numbers of K to-be-decoded information bits.

The first sequence includes serial numbers of L polarized channels, L is a positive integer, L is equal to K or N, N is a mother code length of a polar code, $N=2^n$, n is a positive integer, K is a quantity of the to-be-decoded information bits, and K is less than or equal to N.

Step 702: Select serial numbers of K polarized channels from the first sequence based on a rate matching scheme and/or a reliability order. When the rate matching scheme is puncturing, selecting the serial numbers of the K polarized channels from the first sequence based on the rate matching scheme and the reliability order is selecting, from the first sequence, serial numbers of K polarized channels with highest reliability other than a polarized channel corresponding to a serial number of a punctured bit and a pre-frozen polarized channel. When the rate matching scheme is shortening, selecting the serial numbers of the K polarized channels from the first sequence based on the rate matching scheme and the reliability order is selecting, from the first sequence, serial numbers of K polarized channels with highest reliability other than a polarized channel corresponding to a shortened bit. In practice, there may be some other polarized channels that need to be pre-frozen. In this case, during selecting of polarized channels corresponding to the K to-be-decoded information bits, these pre-frozen polarized channels do not need to be considered. A specific selection method is similar to that used at a coding side.

Step 703: Perform polar code decoding on the to-be-decoded information bits based on the selected serial numbers of the K polarized channels.

Optionally, the first sequence is all or a subsequence of a second sequence, where the second sequence includes serial numbers of $N_{max}$ polarized channels, the serial numbers of the $N_{max}$ polarized channels are arranged in the second sequence in ascending or descending order of reliability of the $N_{max}$ polarized channels, $N_{max}$ is a positive integer, $N_{max}$ is greater than or equal to N, and a reliability order of the serial numbers of the polarized channels in the first sequence is consistent with a reliability order of serial numbers, of polarized channels, less than N in the second sequence. Therefore, only the second sequence corresponding to $N_{max}$ may be prestored, or a plurality of possible first sequences may be prestored. For a specific sequence, for example, a sequence storing a serial number of a PBCH subchannel, refer to the foregoing example sequences at the coding side, and details are not described herein again.

Optionally, rate de-matching is performed on a to-be-decoded bit sequence based on a target code length.

According to the decoding method provided in this embodiment, after the to-be-decoded bits that are input are received, the quantity K of the to-be-decoded information bits is determined based on the target code length N of the polar code. If the second sequence is known, regardless of whether the second sequence is calculated online or pre-calculated and prestored, the first sequence may be obtained from the second sequence. When $N_{max}$=N, the second sequence is the first sequence. The second sequence includes a reliability order of a maximum code length $N_{max}$ of polarized channels supported by a communication system. Optionally, the first sequence may be obtained from the prestored second sequence, then the serial numbers of the to-be-decoded information bits are determined based on the first sequence, and finally polar decoding is performed on the to-be-decoded bits, to obtain a sequence of the K to-be-decoded information bits.

Figure 8:
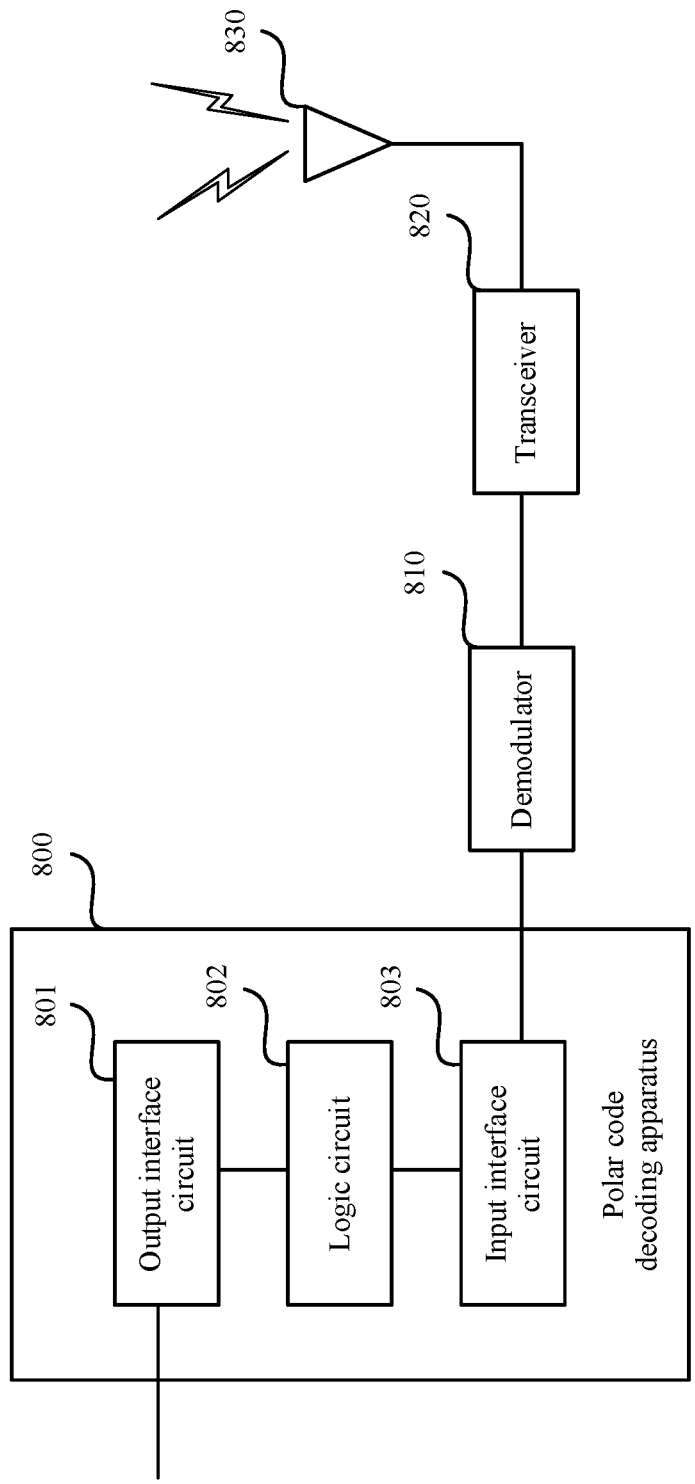
FIG. 8 is a first schematic structural diagram of a polar code decoding apparatus according to an embodiment of this application.

Based on a same inventive concept as the polar code decoding method shown in FIG. 7, as shown in FIG. 8, an embodiment of this application further provides a polar code decoding apparatus 800. The polar decoding apparatus 800 is configured to perform the polar code decoding method shown in FIG. 7. A part or all of the polar code decoding method shown in FIG. 7 may be implemented by hardware or software. When the polar code decoding method is implemented by hardware, the polar code decoding apparatus 800 includes: an input interface circuit 803, configured to obtain to-be-decoded bits; a logic circuit 802, configured to perform the polar code decoding method shown in FIG. 7, where for details, refer to the descriptions in the foregoing method embodiment, and details are not described herein again; and an output interface circuit 801, configured to output a decoded bit sequence.

Further, an antenna 830 receives a signal, and the signal is input by a transceiver 820 to a demodulator 810 for corresponding processing (including but not limited to processing such as digital-to-analog conversion and/or frequency conversion), and then is input to the decoding apparatus 800 for decoding.

Optionally, in a specific implementation, the polar code decoding apparatus 800 may be a chip or an integrated circuit.

Figure 9:
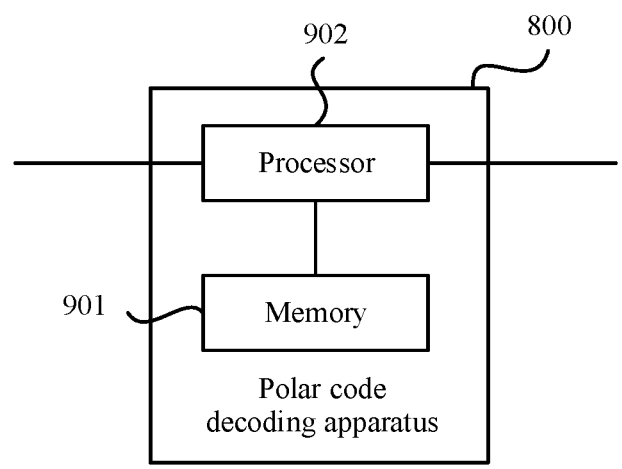
FIG. 9 is a second schematic structural diagram of a polar code decoding apparatus according to an embodiment of this application.

Optionally, when a part or all of the polar code decoding method in the foregoing embodiment is implemented by software, as shown in FIG. 9, the polar decoding apparatus 800 includes: at least one memory 901, configured to store a program; and at least one processor 902, configured to execute the program stored in the memory 901, so that when the program is executed, the polar code decoding apparatus 800 can implement the polar code decoding method provided in the embodiment in FIG. 7.

Figure 10:
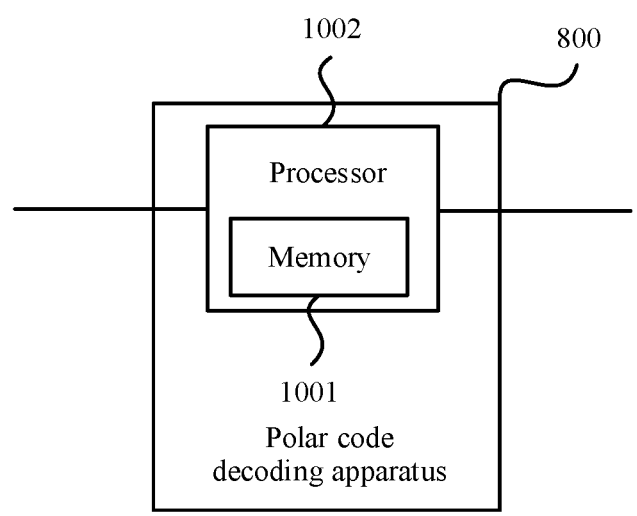
FIG. 10 is a third schematic structural diagram of a polar code decoding apparatus according to an embodiment of this application.

Optionally, the memory 901 may be a physically independent unit. Alternatively, as shown in FIG. 10, a memory 1001 is integrated with a processor 1002.

Optionally, when a part or all of the decoding method in the embodiment in FIG. 7 is implemented by software, the polar code decoding apparatus 800 may alternatively include only a processor 902. A memory 901 configured to store a program is located outside the polar code decoding apparatus 800. The processor 902 is connected to the memory 901 by using a circuit/wire, and is configured to read and execute the program stored in the memory 901.

The processor 902 may be a central processing unit (CPU), a network processor (NP), or a combination of a CPU and an NP.

The processor 902 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory in the foregoing embodiments may include a volatile memory, for example, a random access memory (RAM). The memory may alternatively include a non-volatile memory, for example, a flash memory, a hard disk drive (HDD), or a solid-state drive (SSD). The memory may further include a combination of the foregoing types of memories.

Figure 11:
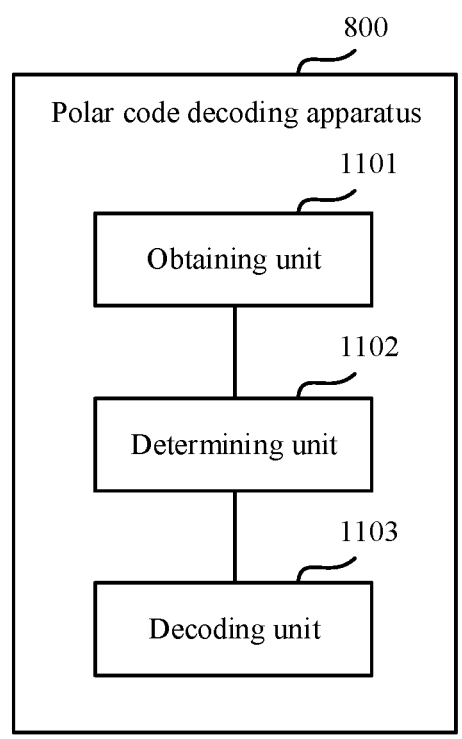
FIG. 11 is a fourth schematic structural diagram of a polar code decoding apparatus according to an embodiment of this application.

Based on the polar code decoding method shown in FIG. 7, as shown in FIG. 11, an embodiment of this application further provides a polar code decoding apparatus 800. The polar decoding apparatus 800 is configured to perform the polar code decoding method shown in FIG. 7. The polar decoding apparatus 800 includes:

an obtaining unit 1101, configured to obtain a first sequence used to determine K to-be-decoded information bits, where the first sequence includes serial numbers of L polarized channels, L is a positive integer, L is equal to K or N, N is a mother code length of a polar code, $N=2^n$, n is a positive integer, K is a quantity of the to-be-decoded information bits, and K is less than or equal to N;

a determining unit 1102, configured to determine serial numbers of K polarized channels in the first sequence based on a rate matching scheme and/or a reliability order; and a coding unit 1103, configured to perform polar code decoding based on the selected serial numbers of the K polarized channels.

The first sequence may be any one of the foregoing example sequences, or may be obtained by extracting serial numbers (where the serial numbers start from 0) less than N from a second sequence with a length of $N_{max}$. Alternatively, reliability of an $i^{th}$ polarized channel in N polarized channels may be determined by using any one of the foregoing example formulas.

An embodiment of this application further provides a computer storage medium. The computer storage medium stores a computer program, and the computer program is configured to perform the polar code decoding method shown in FIG. 7.

An embodiment of this application further provides a computer program product including instructions. When the computer program product runs on a computer, the computer is enabled to perform the polar code decoding method shown in FIG. 7.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, to generate computer-implemented processing. Therefore, the instructions executed on the computer or the another programmable device provide steps for implementing a specific function in one or more processes in the flowcharts and/or in one or more blocks in the block diagrams.

Although some embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the scope of the embodiments of this application. This application is intended to cover these modifications and variations provided that they fall within the scope of protection defined by the following claims and their equivalent technologies.

What is claimed is:

1. A polar code coding method, comprising:
    obtaining, by a coding apparatus, K to-be-coded bits;
    selecting, by the coding apparatus, a first sequence from a polar code construction sequence table based on a coding parameter, wherein the polar code construction sequence table comprises at least one coding parameter and at least one sequence corresponding to the at least one coding parameter, wherein the at least one coding parameter is mapped to the at least one sequence in a one-to-one manner and the first sequence is one of the at least one sequence, wherein the first sequence consists of serial numbers of L polarized channels and the serial numbers are arranged in ascending or descending order of reliability of the polarized channels, wherein the reliability of the polarized channels corresponds to the serial numbers of the polarized channels, and the coding parameter comprises at least one of a mother code length of N, a quantity of to-be-coded information bits, or a quantity of bits obtained after rate matching, and wherein L is equal to K or N, K is less than or equal to N, $N=2^n$, and K, L, N and n are positive integers;
    placing, by the coding apparatus, the K to-be-coded bits based on serial numbers of K polarized channels determined based on the first sequence;
    performing, by the coding apparatus, polar coding on the to-be-coded bits to obtain a coded bit sequence; and
    outputting, by the coding apparatus, the coded bit sequence.

2. The method according to claim 1, wherein the serial numbers of the K polarized channels determined based on the first sequence are determined based on at least one of a rate matching scheme and a reliability order.

3. The method according to claim 1, wherein the first sequence is all or a subsequence of a second sequence, and wherein:
    the second sequence comprises serial numbers of $N_{max}$ polarized channels, the serial numbers of the $N_{max}$ polarized channels are arranged in the second sequence in ascending or descending order of reliability of the $N_{max}$ polarized channels, $N_{max}$ is a positive integer, $N_{max}$ is greater than or equal to N, and a reliability order of the serial numbers of the polarized channels in the first sequence is consistent with a reliability order of serial numbers of polarized channels less than N in the second sequence.

4. The method according to claim 3, wherein at least one of the first sequence or the second sequence is prestored.

5. The method according to claim 1, wherein the first sequence is used for polar coding of a physical broadcast channel (PBCH) and is stored as [247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511] in a natural order, wherein the serial numbers of the polarized channels that correspond to the first sequence start from 0.

6. The method according to claim 5, wherein polarized channels whose serial numbers are [446, 478, 487, 490, 491, 492, 493, 494, 495, 497, 498, 499, 500, 501, 502, 503, 504, 505, 506, 507, 508, 509, 510, 511] in the first sequence are used to place cyclic redundancy check bits.

7. The method according to claim 1, wherein the K to-be-coded bits comprise cyclic redundancy check bits.

8. The method according to claim 1, wherein the K to-be-coded bits comprise parity check bits.

9. The method according to claim 1, wherein after performing polar coding on the to-be-coded bits, the method further comprises:
    performing, by the coding apparatus, based on a target code length, rate matching on the coded bit sequence obtained after the polar coding.

10. A polar coding apparatus, comprising:
    at least one memory, configured to store a program; and
    a processor configured to execute the program stored in the memory, wherein when the program is executed, the processor is configured to:
    obtain K to-be-coded bits;
    select a first sequence from a polar code construction sequence table based on a coding parameter, wherein the polar code construction sequence table comprises at least one coding parameter and at least one sequence corresponding to the at least one coding parameter, wherein the at least one coding parameter is mapped to the at least one sequence in a one-to-one manner and the first sequence is one of the at least one sequence, wherein the first sequence consists of serial numbers of L polarized channels and the serial numbers are arranged in ascending or descending order of reliability of the polarized channels, wherein the reliability of the polarized channels corresponds to the serial numbers of the polarized channels, and the coding parameter comprises at least one of a mother code length of N, a quantity of to-be-coded information bits, or a quantity of bits obtained after rate matching, and wherein L is equal to K or N, K is less than or equal to N, $N=2^n$, and K, L, N and n are positive integers;

determine serial numbers of K polarized channels in the first sequence based on at least one of a rate matching scheme and a reliability order;

place the K to-be-coded bits based on the determined serial numbers of the K polarized channels;

perform polar coding on the K to-be-coded bits to obtain a coded bit sequence; and output the coded bit sequence.

11. The apparatus according to claim 10, wherein the first sequence is all or a subsequence of a second sequence, and wherein:

the second sequence comprises serial numbers of $N_{max}$ polarized channels, the serial numbers of the $N_{max}$ polarized channels are arranged in the second sequence in ascending or descending order of reliability of the $N_{max}$ polarized channels, $N_{max}$ is a positive integer, $N_{max}$ is greater than or equal to N, and a reliability order of the serial numbers of the polarized channels in the first sequence is consistent with a reliability order of serial numbers of polarized channels less than N in the second sequence.

12. The apparatus according to claim 11, wherein at least one of the first sequence or the second sequence is prestored.

13. The apparatus according to claim 10, wherein the first sequence is used for polar coding of a physical broadcast channel (PBCH) and is stored as [247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511] in a natural order, wherein the serial numbers of the polarized channels that correspond to the first sequence start from 0.

14. The apparatus according to claim 13, wherein polarized channels whose serial numbers are [446, 478, 487, 490, 491, 492, 493, 494, 495, 497, 498, 499, 500, 501, 502, 503, 504, 505, 506, 507, 508, 509, 510, 511] in the first sequence are used to place cyclic redundancy check bits.

15. The apparatus according to claim 10, wherein the serial numbers of the N polarized channels are 0 to (N-1) or 1 to N.

16. The apparatus according to claim 10, wherein the K to-be-coded bits comprise cyclic redundancy check bits.

17. The apparatus according to claim 10, wherein the K to-be-coded bits comprise parity check bits.

18. A non-transitory computer readable storage medium storing instructions that, when executed by a processor, cause the processor to:

obtain K to-be-coded bits;

select a first sequence from a polar code construction sequence table based on a coding parameter, wherein the polar code construction sequence table comprises at least one coding parameter and at least one sequence corresponding to the at least one coding parameter, wherein the at least one coding parameter is mapped to the at least one sequence in a one-to-one manner and the first sequence is one of the at least one sequence, wherein the first sequence consists of serial numbers of L polarized channels and the serial numbers are arranged in ascending or descending order of reliability of the polarized channels, wherein the reliability of the polarized channels corresponds to the serial numbers of the polarized channels, and the coding parameter comprises at least one of a mother code length of N, a quantity of to-be-coded information bits, or a quantity of bits obtained after rate matching, and wherein L is equal to K or N, K is less than or equal to N, $N=2^n$, and K, L, N and n are positive integers;

place the K to-be-coded bits based on serial numbers of K polarized channels determined based on the first sequence;

perform polar coding on the to-be-coded bits to obtain a coded bit sequence; and output the coded bit sequence.

* * * * *